United States Patent
Turenne et al.

(10) Patent No.: US 9,617,160 B2
(45) Date of Patent: Apr. 11, 2017

(54) COVER FLUX AND METHOD FOR SILICON PURIFICATION

(71) Applicants: Alain Turenne, Kitchener (CA); Abdallah Nouri, Brampton (CA); Christain Alfred, Vaughan (CA)

(72) Inventors: Alain Turenne, Kitchener (CA); Abdallah Nouri, Brampton (CA); Christain Alfred, Vaughan (CA)

(73) Assignee: Silicor Materials Inc., San Jose, CA (US)

(*) Notice: Subject to any disclaimer, the term of this patent is extended or adjusted under 35 U.S.C. 154(b) by 0 days.

(21) Appl. No.: 14/764,491

(22) PCT Filed: Jan. 29, 2014

(86) PCT No.: PCT/IB2014/000249
§ 371 (c)(1),
(2) Date: Jul. 29, 2015

(87) PCT Pub. No.: WO2014/118630
PCT Pub. Date: Aug. 7, 2014

(65) Prior Publication Data
US 2015/0360960 A1   Dec. 17, 2015

Related U.S. Application Data

(60) Provisional application No. 61/758,088, filed on Jan. 29, 2013.

(51) Int. Cl.
| | |
|---|---|
| C30B 21/02 | (2006.01) |
| C01B 33/037 | (2006.01) |
| B22D 27/18 | (2006.01) |
| C30B 29/06 | (2006.01) |
| C30B 11/00 | (2006.01) |

(52) U.S. Cl.
CPC ............ *C01B 33/037* (2013.01); *B22D 27/18* (2013.01); *C30B 11/00* (2013.01); *C30B 21/02* (2013.01); *C30B 29/06* (2013.01)

(58) Field of Classification Search
CPC ....... B22D 27/18; C01B 33/037; C30B 21/02; C30B 29/06
USPC .......................................................... 65/33.9
See application file for complete search history.

(56) References Cited

U.S. PATENT DOCUMENTS 4,304,763 A * 12/1981 Dietl ..................... C01B 33/037
                                                                 423/348
2011/0217225 A1   9/2011 Schmid et al.

FOREIGN PATENT DOCUMENTS

| | | |
|---|---|---|
| CA | 1124991 A1 | 6/1982 |
| CN | 101680110 A | 3/2010 |
| CN | 102134075 A | 7/2011 |
| CN | 202181216 U | 4/2012 |
| CN | 105246620 A | 1/2016 |
| EP | 2890636 B1 | 6/2016 |
| JP | 2016511734 A | 4/2016 |
| TW | 201402881 A | 1/2014 |
| TW | 201442956 A | 11/2014 |
| WO | WO-2004/030044 A2 | 4/2004 |
| WO | WO-2006095664 A1 | 9/2006 |
| WO | WO-2010080777 A1 | 7/2010 |
| WO | WO-2012/065271 A1 | 5/2012 |
| WO | WO-2014/004441 A1 | 1/2014 |
| WO | WO-2014/036373 A1 | 3/2014 |
| WO | WO-2014/118630 A1 | 8/2014 |

OTHER PUBLICATIONS

European Application Serial No. 14745717.0, Extended European Search Report mailed Jul. 7, 2016, 8 pgs.
"International Application Serial No. PCT/IB2014/000249, International Preliminary Report on Patentability mailed Aug. 13, 2015", 15 pgs.
"International Application Serial No. PCT/IB2014/000249, International Search Report mailed Jul. 2, 2014", 7 pgs.
"International Application Serial No. PCT/IB2014/000249, Written Opinion mailed Jul. 2, 2014", 13 pgs.
Zhang, L, et al., "Removal of Boron from Molten Silicon using $Na_2O$—CaO—$SiO_2$ Slags", *Separation Science and Technology* vol. 48, No. 7, (Mar. 27, 2013), 1140-1144.
Chinese Application Serial No. 201480011013.7, Office Action mailed Jul. 5, 2016, 6 pgs.

* cited by examiner

*Primary Examiner* — Mark Halpern
(74) *Attorney, Agent, or Firm* — Schwegman Lundberg & Woessner, P.A.

(57) ABSTRACT

Cover flux devices and methods are shown. Methods and devices are shown such that, as a solidification front moves from a cooling surface of a mold towards a surface of molten silicon substantially opposite the cooling surface, impurities are driven out of the solid silicon and into the liquid to react with a flux layer on the silicon.

7 Claims, 5 Drawing Sheets

COVER FLUX AND METHOD FOR SILICON PURIFICATION

This application is a 371 of PCT/IB2014/000249 filed 29 Jan. 2014.

The present application claims the benefit of priority to U.S. Provisional Application No. 61/758,088, filed Jan. 29, 2013, which is incorporated herein by reference in its entirety.

BACKGROUND

Solar cells can be a viable energy source by utilizing their ability to convert sunlight to electrical energy. Silicon is a semiconductor material used in the manufacture of solar cells; however, a limitation of silicon use relates to the cost of purifying it to solar grade (SG).

Several techniques used to purify silicon for solar cells are known. Most of these techniques operate on the principle that while silicon is solidifying from a molten solution, undesirable impurities can tend to remain in the molten solution. For example, the float zone technique can be used to make monocrystalline ingots, and uses a moving liquid zone in a solid material, moving impurities to edges of the material. In another example, the Czochralski technique can be used to make monocrystalline ingots, and uses a seed crystal that is slowly pulled out of a solution, allowing the formation of a monocrystalline column of silicon while leaving impurities in the solution. In yet another example, the Bridgeman or heat exchanger techniques can be used to make multicrystalline ingots, and use a temperature gradient to cause directional solidification.

BRIEF DESCRIPTION OF THE DRAWINGS

In the drawings, like numerals can be used to describe similar elements throughout the several views. Like numerals having different letter suffixes can be used to represent different views of similar elements. The drawings illustrate generally, by way of example, but not by way of limitation, various examples discussed in the present document.

DETAILED DESCRIPTION

This disclosure describes an apparatus and method for purifying silicon using directional solidification. The apparatus and method can include the use of a cover flux that reduce impurities within the molten silicon. The apparatus and method of the present invention can be used to make silicon crystals for use in solar cells.

DEFINITIONS

The singular forms "a," "an" and "the" can include plural referents unless the context clearly dictates otherwise.

As used herein, "directional solidification" or "directionally solidify" and the like can refer to crystallizing a material starting in approximately one location, proceeding in an approximately linear direction (e.g. vertically, horizontally, or perpendicular to a surface), and ending in approximately another location. As used in this definition, a location can be a point, a plane, or a curved plane, including a ring or bowl shape.

As used herein, "refractory material" can refer to a material which is chemically and physically stable at high temperatures, particularly at high temperatures associated with melting and directionally solidifying silicon. Examples of refractory materials include but are not limited to aluminum oxide, silicon oxide, magnesium oxide, calcium oxide, zirconium oxide, chromium oxide, silicon carbide, graphite, or a combination thereof.

As used herein, "silicon" can refer to the element having the chemical symbol Si, and can refer to Si in any degree of purity, but generally refers to silicon that is at least 50% by weight pure, preferably 75% by weight pure, more preferably 85% pure, more preferably 90% by weight pure, and more preferably 95% by weight pure, and even more preferably 99% by weight pure.

Figure 1:
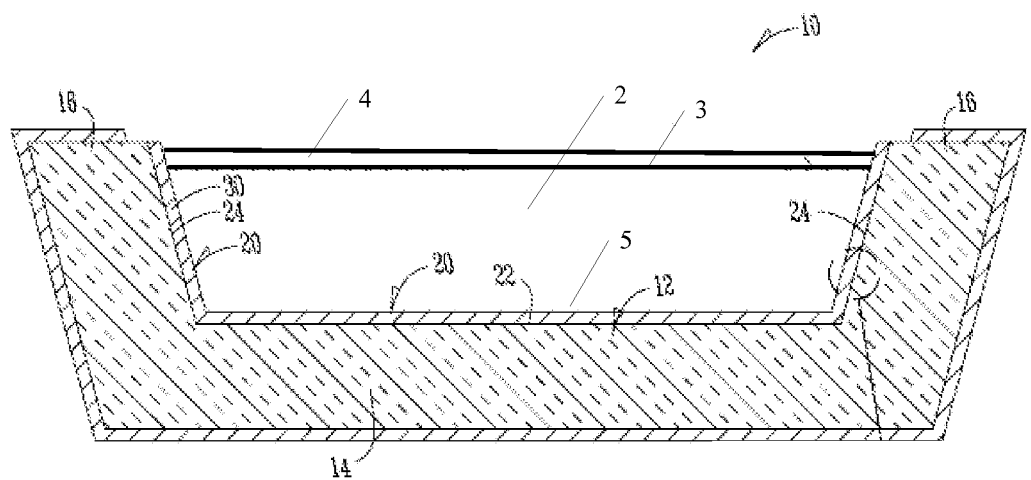
FIG. 1 is a cross sectional view of a mold for use in a process of purifying silicon, according to an embodiment of the invention.

FIG. 1 shows an example of a mold 10 according to the present disclosure. In the present disclosure, the mold is defined as a vessel in which directional solidification is carried out. The mold 10 can be formed from at least one refractory material 12 that is configured to provide for directional solidification of molten silicon.

The mold 10 can have a bottom 14 and one or more sides 16 extending upwardly from the bottom 14. The mold 10 can be shaped similar to a thick-walled large bowl, which can have a circular or generally circular cross-section. The mold 10 can have other cross-sectional shapes, including, but not limited to, a square shape, or a hexagon, octagon, pentagon, or any suitable shape, with any suitable number of edges.

The bottom 14 and sides 16 define an interior of the mold 10 that can receive a molten material, such as molten silicon 2. The interior can also receive a solid material, such as solid silicon (not shown), that can be melted to form the molten material. The refractory material 12 can include an inner surface 20 that faces the interior. In an example, the inner surface 20 comprises an upper surface 22 of the bottom 14 and an inner surface 24 of the one or more sides 16.

The refractory material 12 can be any suitable refractory material, particularly a refractory material that is suitable for a mold for melting or directional solidification of silicon. Examples of materials that can be used as the refractory material 12 include, but are not limited to aluminum oxide ($Al_2O_3$, also referred to as alumina), silicon oxide ($SiO_2$, also referred to as silica), magnesium oxide (MgO, also referred to as magnesia), calcium oxide (CaO), zirconium oxide ($ZrO_2$, also referred to as zirconia), chromium (III) oxide ($Cr_2O_3$, also referred to as chromia), silicon carbide (SiC), graphite, or a combination thereof. The mold 10 can include one refractory material, or more than one refractory material. The refractory material or materials that are included in the mold 10 can be mixed, or they can be located in separate parts of the mold 10, or a combination thereof. The one or more refractory materials 12 can be arranged in layers. The mold 10 can include more than one layer of one or more refractory materials 12. The mold 10 can include one layer of one or more refractory materials 12. The sides 16 of the mold 10 can be formed from a different refractory material than the bottom 14. The sides 16 as compared to the bottom 14 of the mold 10 can be different thicknesses, include different compositions of material, include different amounts of material, or a combination thereof. In an example, the sides 16 can include a hot face refractory, such as aluminum oxide. The bottom 14 of the mold 10 can include a heat-conductive material, such as, for example, silicon carbide, graphite, steel, stainless steel, cast iron, copper, or a combination thereof. In an example, the sides 16 include an aluminum oxide (alumina) refractory material, and the bottom 14 includes a silicon carbide refractory with a phosphorus binder.

Impurities can be passed from the refractory material 12 to the molten silicon 2 such that the impurity levels of some impurities can be higher than is acceptable for use of the silicon in photovoltaic devices. For example, boron or phosphorus impurities can be present in the refractory material 12. Even at very small boron or phosphorus levels, at the high temperatures experienced by the refractory material 12 due to the present of the molten silicon 2, the boron or phosphorus can be driven to diffuse out of the refractory material 12 and into the molten silicon 2.

In one example, a lining 30 is included on the inner surface 20 of the refractory material 12, such as onto the upper surface 22 and the inner surface or surfaces 24. The lining 30 can be configured to prevent or reduce contamination of the molten silicon 2, such as via the transfer of impurities, such as boron (B) and phosphorus (P) from the refractory material 12 of the mold 10 into the molten silicon 2, or via reaction an impurity or contaminant from the refractory material 12 into the molten silicon 2. The lining 30 can provide a barrier to the contaminants or impurities that can be present within the refractory material 12. Although a lining 30 is shown in FIG. 1, other mold examples, may not include a lining.

In one example, the lining 30 includes alumina ($Al_2O_3$). While alumina is an effective barrier to a number of impurities, such as boron (B) and phosphorus (P), one technical challenge with alumina is that it can undergo a reduction reaction in the presence of the molten silicon 2 to form metallic aluminum (Al) at levels that are undesirable in the molten silicon 2.

FIG. 1 shows a cover flux 4 located on the top surface of the silicon 2. Examples of flux materials include, but are not limited to, at least one of sodium carbonate ($Na_2CO_3$), calcium oxide (CaO), calcium fluoride ($CaF_2$), silicon dioxide $SiO_2$ and silicon nitride $Si_3N_4$. Selected examples of flux compositions are included in the following table. In one example, the flux includes a glass material formed using one or more of the listed flux components.

|  | $Na_2CO_3$ | $SiO_2$ | $CaF_2$ | CaO | $Si_3N_4$ |
| --- | --- | --- | --- | --- | --- |
| Flux 1 | 50.6 | 42.7 | 5.0 | 1.7 | 0 |
| Flux 2 | 50.6 | 44.4 | 5.0 | 0 | 0 |
| Flux 3 | 50.6 | 34.4 | 5.0 | 0 | 10.0 |

In one example, the addition of a flux removes impurities that were present in the silicon source material. In one example, the addition of a flux removes impurities from the refractory 12 that are not stopped by the lining 30. In one example, the addition of a flux removes aluminum that may be introduced into the silicon 2 by alumina from the lining 30.

The cover flux 4 shown in FIG. 1 is located on a top surface 3 of the silicon 2. In directional solidification, as a solidification front moves from a bottom of the mold 5 towards the top surface 3 of the silicon 2, impurities are driven out of the solid silicon and into the liquid, which results in concentration of impurities at the top surface 3 of the silicon at the end of the solidification process. In the configuration shown, because the impurities are driven upward towards the cover flux 4, the flux is more effective at reacting with the impurities. The process of forming the cover flux 4 at the top surface 3 of the silicon 2 is discussed in more detail with respect to FIGS. 3 and 4 below.

Although FIG. 1 shows an example configuration where the directional solidification moves from a bottom of the mold 5 towards a top surface 3 of the silicon, the invention is not so limited. In other examples, directional solidification may move from a top surface of the silicon towards a flux layer located on a bottom surface of the silicon. Other orientations of directional solidification are also possible, such as from one side of the mold to a flux layer located on a second side of the silicon. In one example, directional solidification progresses from a cooling surface of the molten silicon toward a flux layer located on any surface substantially opposite the cooling surface.

Figure 2:
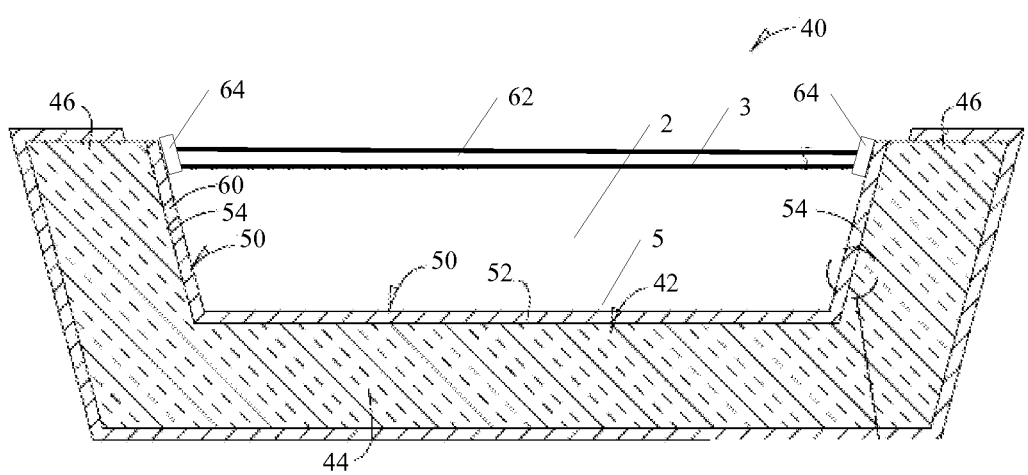
FIG. 2 is a cross sectional view of another mold for use in a process of purifying silicon, according to an embodiment of the invention.

FIG. 2 shows an example of another mold 40, at least partially similar to mold 10 from FIG. 1. The mold 40 can be formed from at least one refractory material 42 that is configured to provide for melting of silicon or directional solidification of molten silicon, or both.

The mold 40 can have a bottom 44 and one or more sides 46 extending upwardly from the bottom 44. The mold 40 can be shaped similar to a thick-walled large bowl, which can have a circular or generally circular cross-section. The mold 40 can have other cross-sectional shapes, including, but not limited to, a square shape, or a hexagon, octagon, pentagon, or any suitable shape, with any suitable number of edges.

The bottom 44 and sides 46 define an interior of the mold 40 that can receive a molten material, such as molten silicon 2. The interior can also receive a solid material, such as solid silicon (not shown), that can be melted to form the molten material. The refractory material 42 can include an inner surface 50 that faces the interior. In an example, the inner surface 50 comprises an upper surface 52 of the bottom 44 and an inner surface 54 of the one or more sides 46.

The refractory material 44 can be any suitable refractory material, such as those listed above with regard to mold 10, and in any suitable physical configuration, such as layers or other configurations listed above with regard to mold 10. A cover flux 62 is further illustrated in FIG. 2. In one example, the cover flux 62 is formed from materials as described above with respect to cover flux 4.

In one example, a first lining 60 is included on the inner surface 50 of the refractory material 42, such as onto the upper surface 52 and the inner surface or surfaces 54. The first lining 60 can be configured to prevent or reduce contamination of the molten silicon 2, such as via the transfer of impurities, such as boron (B) and phosphorus (P) from the refractory material 42 of the mold 40 into the molten silicon 2, or via reaction an impurity or contaminant from the refractory material 42 into the molten silicon 2. The first lining 60 can provide a barrier to the contaminants or impurities that can be present within the refractory material 12.

FIG. 2 further illustrates a second lining 64 that covers a portion of the sides 46 in a localized region at a height that includes the top surface 3 of the molten silicon. In one example, the second lining 64 includes silicon carbide. In one configuration, the second lining 64 includes silicon carbide particles that are bound together to form the second lining 64. In one example the silicon carbide particles are bound together using a colloidal silica matrix to form the second lining 64.

As discussed above, the use of a cover flux (4, 62) provides an additional advantage of impurity removal. In one example, the cover flux (4, 62) removes aluminum that may be introduced by the first lining 60. In one example, the second lining 64 is less reactive with the cover flux than the first lining 60 to provide an easier release of the cover flux from sides 46 of the mold 40 after cooling. By providing an easy release, the first lining 60 is not as easily damaged when removing the silicon 2 from the mold after solidification.

Figure 3:
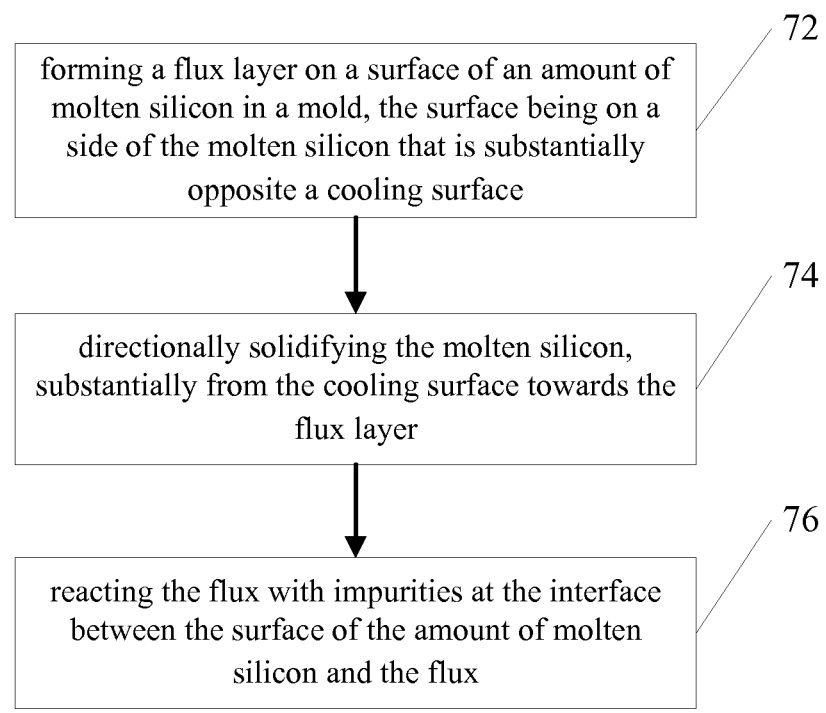
FIG. 3 is a flow diagram of an example method of purifying silicon.

FIG. 3 illustrates an example method of directional solidification that may be performed using molds as described in FIGS. 1 and 2. In operation 72, a flux layer is formed on a surface of an amount of molten silicon in a mold. In one example, the surface is on a side of the molten silicon that is substantially opposite a cooling surface. In operation 74, the molten silicon is directionally solidified, substantially from the cooling surface towards the flux layer. In operation 76, the flux is reacted with impurities at the interface between the surface of the amount of molten silicon and the flux.

Figure 4:
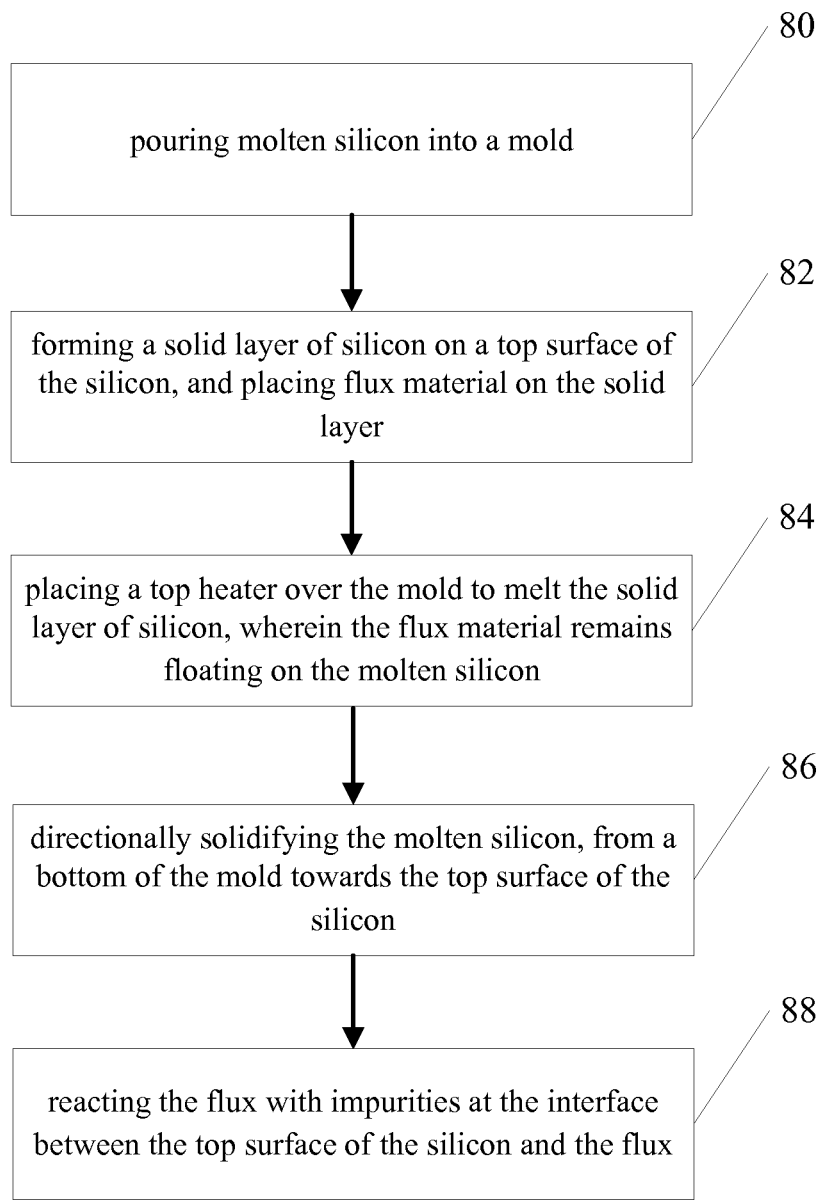
FIG. 4 is another flow diagram of an example method of purifying silicon.

FIG. 4 illustrates another example method of directional solidification that may be performed using molds as described in FIGS. 1 and 2. In operation 80, molten silicon is poured into a mold. In operation 82, a solid layer of silicon is formed on a top surface of the silicon, and flux material is placed on the solid layer. In one example, the silicon is cooled just enough to form a solid layer on the top surface. The solid layer provides structure for the added flux material, and keeps the flux material from splashing into the molten silicon and mixing deep within the molten silicon. In selected embodiments, the flux material includes chunks of flux glass that are placed on the solid layer of the silicon.

When fused glass flux is used, the weight of the flux may be reduced in contrast to mixed powder components of flux. In one example, fused glass flux may be approximately 20 percent lighter than mixed powder components. In one example, powder components of the flux are acid washed prior to fusing to form flux glass. Acid washing flux powders may reduce contamination that may be present on component powders.

In operation 84, the solid layer of silicon is re-melted and the flux material remains floating on the molten silicon. In one example, a top heater is placed over the mold to melt the solid layer of silicon, and the flux material remains floating on the molten silicon. In another example, heat is applied in a method other than a top heater, such as by placing the mold in a furnace. In another example the cover flux layer is formed by heat from the silicon itself, without external heat being applied. In one embodiment, the flux material composition is chosen to be less dense than molten silicon, thereby facilitating the floating of the flux material on molten silicon. Despite a difference in density, it is helpful to first provide the solid layer of operation 82 on the top surface of the silicon in order to form the cover flux.

In operation 86, the molten silicon is directionally solidified, from a bottom of the mold towards the top surface of the silicon, and in operation 88, the flux is reacted with impurities at the interface between the top surface of the silicon and the flux.

Figure 5:
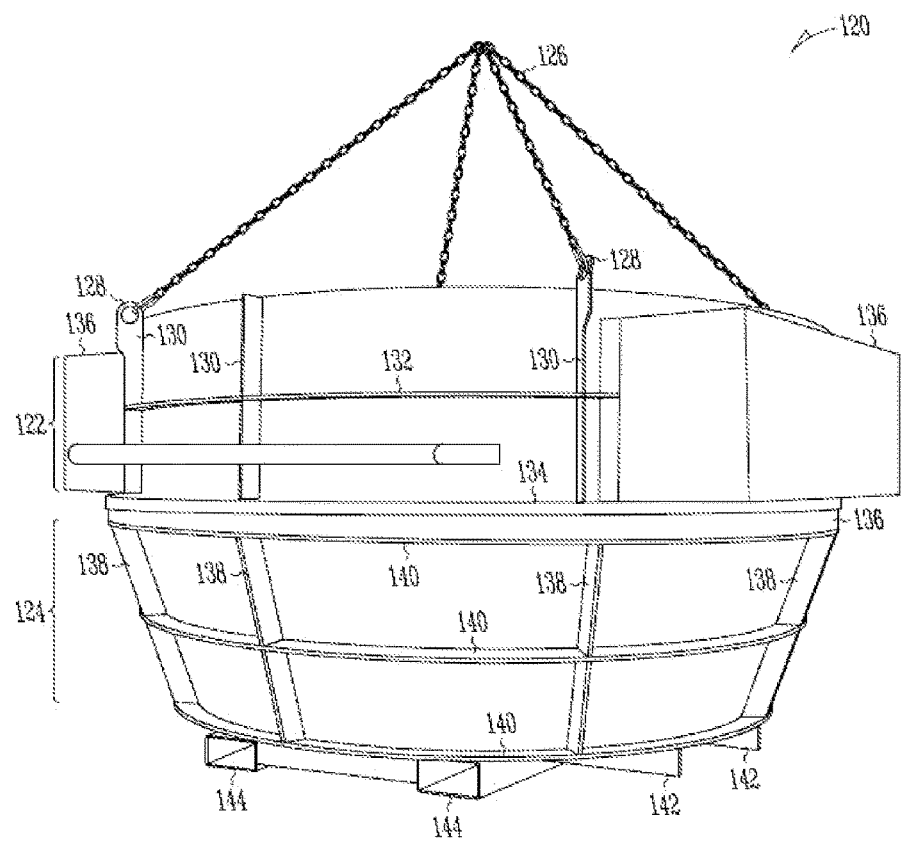
FIG. 5 is an isometric view of a directional solidification system, according to an embodiment of the invention.

FIG. 5 illustrates an example of a system 120 for directional solidification of silicon. The system 120 is shown as one example directional solidification system that may be used to purify silicon using cover flux as described in examples above. Other systems, such as alternate heater configurations, alternate mold geometries, etc. may also be used with embodiments of the invention.

The system 120 of FIG. 1 includes a top heater 122 positioned on top of a mold 124. Chains 126 can be connected to the top heater 122 via holes 128 in vertical structural members 130. The chains 126 can form a bridle, which can allow the top heater 122 to be moved by the use of a crane. The system can also be moved, for example, by placing the mold 124 on a scissor lift while leaving the top heater 122 over the mold 124.

The vertical structural members 130 can extend vertically from the bottom edge of an outer jacket of the top heater 122 to a top edge of the outer jacket of the top heater 122. The vertical structural members 130 can be located on the outside of the top heater outer jacket and extend from the jacket parallel to a direction that is away from the center of the top heater 122. The top heater 122 can also include one or more horizontal structural members 132, which can be located on the outside of the top heater outer jacket and can extend from the jacket in a direction that is parallel to a direction that is away from the center of the top heater 122. The top heater 122 can also include a lip 134 that can be part of the outer jacket of the top heater 122. The lip 134 can protrude away from the outer jacket of the top heater 122. The lip 134 can extend inward toward the center axis of the top heater 122 such that it covers insulation of the top heater 122 to any suitable extent. Alternatively, the lip 134 can extend inward only enough to cover the bottom edge of the outer jacket of the top heater 122. One or more screen boxes 136 can enclose ends of heating members that protrude from the outer jacket of the top heater 122, protecting users from the heat and electricity that can be present in and near the ends of these members.

Insulation 138 can be located between the top heater 122 and the mold 124. At least part of the one or more insulating layers of the mold 124 can extend above the height of the outer jacket of the mold 124. The mold 124 can include one or more vertical structural members 140. The vertical structural members 140 can be located on an outer surface of the outer jacket of the mold 124, extending away from the outer jacket parallel to a direction that is away from the center of the mold 124. The vertical structural members 140 can extend vertically from the bottom edge of the outer jacket to the top edge of the outer jacket. The mold 124 can also include one or more horizontal structural members 142. The horizontal structural members 142 can be located on the outer surface of the outer jacket of the mold 124, extending away from the outer jacket parallel to a direction that is away from the center of the mold 124. The horizontal structural members 142 can extend horizontally around the circumference of the mold 124. The mold 124 can also include bottom structural members 144 and 146. The bottom structural members 144 and 146 can extend away from the outer jacket parallel to a direction that is away from the center of the mold 124. The bottom structural members 144 and 146 can extend across the bottom of the mold 124. Some of the bottom structural members 146 can be shaped such that they allow a forklift or other machine to lift or otherwise physically manipulate the apparatus.

Figure 6:
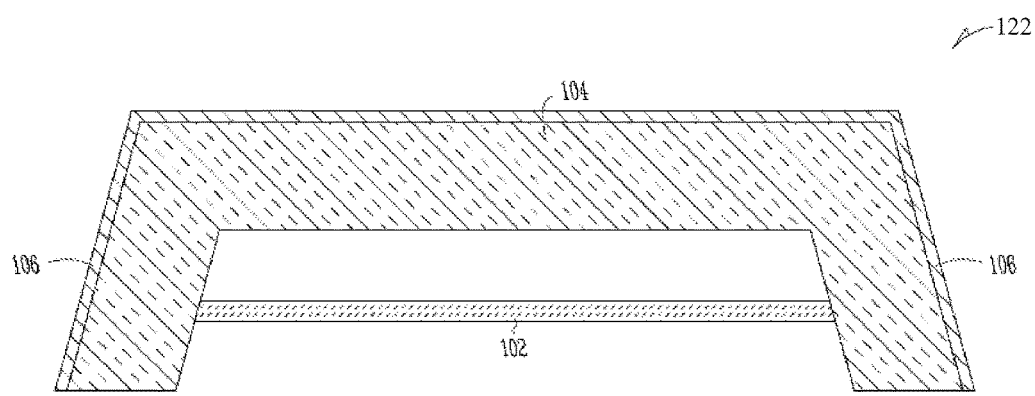
FIG. 6 is a cross-sectional view of a heater that can be used for directional solidification of silicon, according to an embodiment of the invention.

A cross sectional view of selected portions of the top heater 122 is shown in more detail in FIG. 6. The top heater can have a cross-sectional shape that approximately matches the cross-sectional shape of the mold. Application of heat to the mold by the top heater can allow for control of the temperature of the molten silicon in the mold. The top heater can also be positioned on top of the mold without heating, so that the top heater can serve as an insulator to control the release of heat from the mold. By controlling the temperature or release of heat of the mold, a desired temperature gradient can be provided, which can allow for more highly controlled directional solidification. Ultimately, control over the temperature gradient can allow a more effective directional solidification in which the resulting purity of the silicon is maximized.

The top heater 122 can include one or more heating members 102. Each of the one or more heating members 102 can independently include any suitable material. For example, each of the one or more heating members 102 can independently include a heating element, where the heating element can include silicon carbide, molybdenum disilicide, graphite, or a combination thereof; and, each of the one or more heating members 102 can alternatively independently include an induction heater. In an example, the one or more heating members are positioned at approximately the same height. In another example, the one or more heating members are positioned at different heights.

In an example, the heating members 102 can include silicon carbide, which can have certain advantages. For example, silicon carbide heating members 102 can be less likely to corrode at high temperatures in the presence of oxygen. Oxygen corrosion can be reduced for heating elements including corrodible materials by using a vacuum chamber, but silicon carbide heating members 102 can avoid corrosion without a vacuum chamber. Additionally, silicon carbide heating members 102 can be used without water-cooled leads. In an example, the heating elements are used in a vacuum chamber, with water-cooled leads, or both. In an example, the heating members 102 are used without a vacuum chamber, without water-cooled leads, or without both.

In an example, the one or more heating members 102 are induction heaters. Induction heaters can be cast into one or more refractory materials. The refractory material containing the induction heating coil or coils can then be positioned over the bottom mold. The refractory material can be any suitable material, including, but not limited to aluminum oxide, silicon oxide, magnesium oxide, calcium oxide, zirconium oxide, chromium oxide, silicon carbide, graphite, or a combination thereof.

The one or more heating members 102 can have an electrical system such that if at least one heating member 102 fails, any remaining functional heating members 102 can continue to receive electricity and to produce heat. In an example, each heating member 102 has its own circuit.

The top heater 100 can include insulation 104. The insulation 104 can include any suitable insulating material, including, but not limited to, insulating brick, a refractory, a mixture of refractories, insulating board, ceramic paper, high temperature wool, or a mixture thereof. Insulating board can include high temperature ceramic board. A bottom edge of the insulating material 104 and the one or more heating members 102 can be at approximately the same height, or the heating members 102 can be positioned above the height of the bottom edge of the insulating material 104, or the bottom edge of the insulating material 104 can be positioned above the height of the heating members 102. Other configurations of the one or more heating members 102 and the insulating material 104 can be used, such as the one or more heating members 102 being an induction heater, the insulating material 104 including a refractory material, wherein the one or more heating members 102 are encased in the refractory material 104. In such an example, additional insulating material can also be optionally included, where the additional insulating material can be refractory material, or the additional insulating material can be another suitable insulating material.

The top heater 100 can include an outer jacket 106. The outer jacket 106 can include any suitable material, including, but not limited to steel, stainless steel, copper, cast iron, a refractory material, a mixture of refractory materials, or a combination thereof. The insulating material 104 can be disposed at least partially between the one or more heating members 102 and the outer jacket 106. The bottom edge of the outer jacket 106 can be approximately even with the bottom edge of the insulating material 104 and with the one or more heating members 102, or the bottom edge of the outer jacket 106 can be offset from the bottom edge of the insulating material 104 or with the one or more heating members 102, or both. In an example, a portion of the outer jacket 106 that covers an edge of the insulating material 104 can include a material with a relatively low conductivity, such as a suitable refractory, such as aluminum oxide, silicon oxide, magnesium oxide, calcium oxide, zirconium oxide, chromium oxide, silicon carbide, graphite, or a combination thereof.

The top heater outer jacket 106 can include structural members, such as members that can add strength or rigidity to the top heater 100. The structural members can include steel, stainless steel, copper, cast iron, a refractory material, a mixture of refractory materials, or a combination thereof. In an example, the top heater outer jacket 106 can include one or more structural members that extend from outside of the top heater outer jacket 106 in a direction that is away from a center of the top heater 100, and that extend horizontally around the circumference or perimeter of the top heater 100. The one or more horizontal structural members can be located, for example, at a lower edge of the outside of the top heater outer jacket 106, at the top edge of the outside of the top heater outer jacket 106, or at any position in between the bottom and top edges of the outside of the top heater outer jacket 106. In an example, the top heater 100 includes three horizontal structural members, with one located at the bottom edge of the top heater outer jacket 106, one located at the upper edge of the top heater outer jacket 106, and one located in-between the lower and upper edges of the top heater outer jacket 106.

The top heater outer jacket 106 can include one or more structural members on the outside of the top heater outer jacket 106 that extend for outside of the top heater outer jacket 106 in a direction that is away from the center of the top heater 100 vertically from the bottom of the outside of the top heater outer jacket 106 to the top of the outside of the top heater outer jacket 106. In an example, the top heater outer jacket 106 can include eight vertical structural members. The vertical structural members can be evenly spaced around the circumference or perimeter of the top heater 100. In an example, the top heater outer jacket 106 can include both vertical and horizontal structural members. The top heater outer jacket 106 can include structural members that extend across the top of the top heater outer jacket 106. The structural member on the top can extend from one outer edge of the top of the top heater outer jacket 106 to another edge of the top of the top heater outer jacket 106. The structural members on the top can also extend partially across the top of the outer jacket 106. The structural members can be strips, bars, tubes, or any suitable structure for adding structural support to the top heater. The structural members can be attached to the top heater outer jacket 106 via welding, brazing, or other suitable method. The structural members can be adapted to facilitate transportation and physical manipulation of the apparatus. For example, the structural members on the top of the outside of the top heater outer jacket 106 can be tubes of sufficient size, strength, orientation, spacing, or a combination thereof, such that a particular fork-lift or other lifting machine could lift or move or otherwise physically manipulate the top heater. In another example, the structural members described above as being located on the outside of the top heater outer jacket 106 can alternatively or additionally be located on the inside of the top heater outer jacket 106. In another example, the top heater 100 can be moved using a crane or other lifting device, using chains attached to the top heater 100, including chains attached to structural members of the top heater or to non-structural members of the top heater 100. For example, chains can be attached to the upper edge of the top heater outer jacket 106 to form a bridle for a crane to lift and otherwise move the top heater 100.

Figure 7:
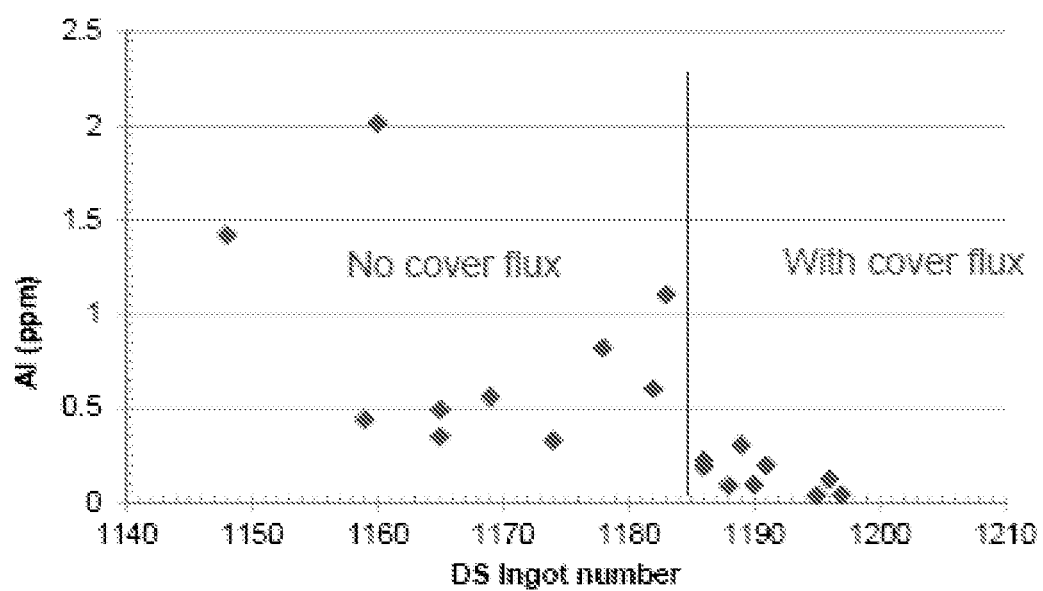
FIG. 7 is a graph showing an amount of impurities from two different purification processes, according to an embodiment of the invention.

FIG. 7 shows experimental results of directional solidification processes with and without a cover flux as described in examples above. Directional solidified (DS) ingots numbered 1140 through 1185 were processed without a cover flux, and the aluminum impurity level can be seen to be as high as 2 ppm. In contrast, DS ingots 1185 through 1210 were processed using a cover flux as described in examples above. As can be seen from the figure, the aluminum impurity levels are all below 0.5 ppm for the ingots processed using a cover flux as described in examples above. Although aluminum impurity levels are illustrated as an example in FIG. 7, other impurities such as boron, phosphorous, etc. may also be removed using a cover flux as described in examples above.

Embodiments

To better illustrate the method and apparatuses disclosed herein, a non-limiting list of embodiments is provided here:

Embodiment 1 is a method that includes forming a flux layer on a surface of an amount of molten silicon in a mold, the surface being on a side of the molten silicon that is substantially opposite a cooling surface, directionally solidifying the molten silicon, substantially from the cooling surface towards the flux layer, and reacting the flux with impurities at the interface between the surface of the amount of molten silicon and the flux Embodiment 2 includes the method of embodiment 1, wherein forming the flux layer includes melting an amount of flux glass on a top surface of the molten silicon.

Embodiment 3 includes the method of any one of embodiments 1-2 wherein forming the flux layer includes forming a flux layer having a density lower than molten silicon.

Embodiment 4 includes the method of any one of embodiments 1-3 wherein forming the flux layer includes forming a flux layer that flows at temperatures greater than approximately 900° C. to 1100° C.

Embodiment 5 includes the method of any one of embodiments 1-4 wherein forming the flux layer includes forming a flux layer including $Na_2CO_3$.

Embodiment 6 include the method of any one of embodiments 1-5 wherein forming the flux layer includes forming a flux layer including $SiO_2$.

Embodiment 7 includes the method of any one of embodiments 1-6 wherein forming the flux layer includes forming a flux layer including $CaF_2$.

Embodiment 8 includes the method of any one of embodiments 1-7 wherein forming a flux layer including CaO.

Embodiment 9 includes the method of any one of embodiments 1-8 wherein forming the flux layer includes forming a flux layer including $Si_3N_4$.

Embodiment 10 is a method that includes pouring molten silicon into a mold, forming a solid layer of silicon on a top surface of the silicon, and placing flux material on the solid layer, placing a top heater over the mold to melt the solid layer of silicon, wherein the flux material remains floating on the molten silicon, directionally solidifying the molten silicon, from a bottom of the mold towards the top surface of the silicon, and reacting the flux with impurities at the interface between the top surface of the silicon and the flux.

Embodiment 11 includes the method embodiment 10, wherein placing a top heater over the mold includes melting the flux material and the solid layer of silicon, wherein the flux material remains floating on the molten silicon.

Embodiment 12 includes the method of any one of embodiments 10-11 wherein placing a top heater over the mold includes applying a temperature greater than approximately 900° C. to the top surface of the silicon.

Embodiment 13 includes the method of any one of embodiments 10-12 wherein placing a top heater over the mold includes applying a temperature greater than approximately 1100° C. to the top surface of the silicon.

Embodiment 14 includes the method of any one of embodiments 10-13 wherein placing a top heater over the mold includes applying a temperature between approximately 1460° C. and 1550° C. to the top surface of the silicon.

Embodiment 15 includes the method of any one of embodiments 10-14 wherein placing flux material on the solid layer includes placing between approximately 10 and 50 Kg of flux material on approximately 1400 Kg of silicon.

Embodiment 16 includes the method of any one of embodiments 10-15 wherein placing flux material on the solid layer includes placing chunks of flux glass on the solid layer and melting the chunks to form a flux layer.

Embodiment 17 includes a directional solidification mold, comprising a mold bottom, including one or more refractory layers, a mold sidewall, including one or more refractory layers, a first lining including aluminum oxide, the first lining covering the mold bottom and the mold sidewall, and a second lining including silicon carbide, the second lining covering a portion of the mold sidewall in a localized region at a height that includes a top surface of molten silicon when the mold is in use.

Embodiment 18 includes the mold of embodiment 17, wherein the first lining includes $Al_2O_3$ of a purity between approximately XXX and YYY.

Embodiment 19 includes the mold of any of embodiment 17-18, wherein the second lining includes a composite material of silicon carbide particles in a colloidal silica ($SiO_2$) matrix.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A method, comprising:
pouring molten silicon into a mold;
forming a solid layer of silicon on a top surface of the silicon, and placing flux material on the solid layer;
placing a top heater over the mold to melt the solid layer of silicon, wherein the flux material remains floating on the molten silicon;
directionally solidifying the molten silicon, from a bottom of the mold towards the top surface of the silicon; and
reacting the flux with impurities at the interface between the top surface of the silicon and the flux.

2. The method of claim 1, wherein placing a top heater over the mold includes melting the flux material and the solid layer of silicon, wherein the flux material remains floating on the molten silicon.

3. The method of claim 1, wherein placing a top heater over the mold includes applying a temperature greater than approximately 900° C. to the top surface of the silicon.

4. The method of claim 1, wherein placing a top heater over the mold includes applying a temperature greater than approximately 1100° C. to the top surface of the silicon.

5. The method of claim 1, wherein placing a top heater over the mold includes applying a temperature between approximately 1460° C. and 1550° C. to the top surface of the silicon.

6. The method of claim 1, wherein placing flux material on the solid layer includes placing between approximately 10 and 50 Kg of flux material on approximately 1400 Kg of silicon.

7. The method of claim 1, wherein placing flux material on the solid layer includes placing chunks of flux glass on the solid layer and melting the chunks to form a flux layer.

* * * * *